(12) United States Patent
Gallagher et al.

(10) Patent No.: US 7,110,195 B2
(45) Date of Patent: Sep. 19, 2006

(54) MONOLITHIC HARD PELLICLE

(75) Inventors: Emily F. Gallagher, Burlington, VT (US); Rogert K. Leidy, Burlington, VT (US); Michael J. Lercel, Williston, VT (US); Kenneth C. Racette, Fairfax, VT (US); Andrew J. Watts, Essex, VT (US)

(73) Assignee: International Business Machines Corporation, Armonk, NY (US)

( * ) Notice: Subject to any disclaimer, the term of this patent is extended or adjusted under 35 U.S.C. 154(b) by 16 days.

(21) Appl. No.: 10/709,326

(22) Filed: Apr. 28, 2004

(65) Prior Publication Data

US 2005/0243452 A1   Nov. 3, 2005

(51) Int. Cl.
*G02B 5/22*   (2006.01)
*G02B 7/00*   (2006.01)
*G02B 27/14*  (2006.01)
*G03F 1/00*   (2006.01)

(52) U.S. Cl. .................. 359/888; 359/629; 359/894; 435/5

(58) Field of Classification Search ........... 359/888, 359/629, 894; 355/53, 75; 430/5; 310/348
See application file for complete search history.

(56) References Cited

U.S. PATENT DOCUMENTS

| 4,405,701 | A |   | 9/1983  | Banks et al. |       |
|-----------|---|---|---------|--------------|-------|
| 4,499,162 | A |   | 2/1985  | Banks et al. |       |
| 4,537,813 | A |   | 8/1985  | Kuyel        |       |
| 5,847,489 | A | * | 12/1998 | Satoh et al. | 310/348 |
| 6,242,136 | B1 |  | 6/2001  | Moore et al. |       |
| 6,280,886 | B1 |  | 8/2001  | Yan          |       |
| 6,410,191 | B1 | * | 6/2002  | Nistler et al. | 430/5 |
| 6,744,562 | B1 | * | 6/2004  | Okada et al. | 359/629 |
| 6,842,228 | B1 | * | 1/2005  | Shu          | 355/75 |

FOREIGN PATENT DOCUMENTS

| JP | 57122438 A | 7/1982  |
|----|------------|---------|
| JP | 59191039 A | 10/1984 |
| JP | 5275306 A  | 10/1993 |

\* cited by examiner

*Primary Examiner*—Audrey Chang
(74) *Attorney, Agent, or Firm*—DeLio & Peterson, LLC; Kelly M. Nowak; Richard M. Kotulak

(57) ABSTRACT

A monolithic optical pellicle and method of making used to protect a photomask during photolithography processing. The monolithic optical pellicle is comprised of a pellicle plate having a recessed central portion integrally formed with a perimeter frame of the pellicle plate such that it is a one-piece optical pellicle. The monolithic optical pellicle comprises a material of sufficient rigidity to minimize distortions in and maximize durability of the pellicle when used in combination with the recessed portion having a thickness that prevents sagging thereof due to applied forces on the resultant monolithic optical pellicle. This recessed central portion is the optical pellicle portion of the present monolithic optical pellicle, while the integral perimeter frame is used to attach the monolithic optical pellicle at the desired stand-off distance to a photomask. The monolithic optical pellicle preferably comprises a material that is transparent to an exposure field at about 157 nm wavelengths.

28 Claims, 3 Drawing Sheets

MONOLITHIC HARD PELLICLE

BACKGROUND OF INVENTION

1. Field of the Invention

This invention relates generally to optical pellicles, and more particularly, to monolithic hard pellicles for use in photolithography and methods of forming the same.

2. Description of Related Art

Pellicles have played an important role in the fabrication of semiconductor circuits. A conventional pellicle is a thin, optically transparent membrane stretched over a rigid metal frame for attachment to a photomask via such frame. In so doing, the pellicle is attached to the photomask such that the membrane is positioned at a distance spaced away from the photomask. The pellicle is then used in photolithography to protect the patterned photomask surfaces from contamination by airborne particles. That is, smaller particles and dust falling onto the pellicle plate is out of focus during the photolithography process, and will not therefore be reproduced in the silicon wafer.

To fabricate a pellicle, a very thin membrane, normally in the range of 0.5 to 3.0 microns and usually made of organic or fluorocarbon polymers, is first formed on a substrate. The membrane is then removed and mounted to the rigid frame. These pellicle frames take many shapes, depending upon the photolithography equipment with which the pellicle is ultimately to be used. The frame always encloses the entire printable area of the mask so that the pellicle it supports is able to keep particles off this critical area.

An emerging photolithography technique is the use of radiation having a 157 nm (nanometer) wavelength to expose the desired circuit pattern from the photomask to the resist layer on the wafer substrate. Extension of optical lithography to 157 nm has received widespread support as it offers the prospect of improved resolution based on decades of optical lithography experience. However, the development of pellicles for use in 157 nm lithography has been challenging due to the high energy of the photons, such as those at energies of about 7.9 eV. This is because most common lithographic materials available for the fabrication of thin (0.5 μm to 2.0 μm) protective pellicles used at 365 nm, 248 nm, and 193 nm exposure wavelengths are either not transparent enough and strongly absorb at the 157 nm wavelength; or are not durable enough to withstand more than a few minutes of exposure without severe degradation at the 157 nm exposure wavelength.

Since no polymers have been found with sufficient radiation durability to be used as pellicles to protect photomasks from contamination at the 157 nm exposure wavelength, thick or hard quartz (crystallized silica) plate pellicles continue to be used at the 157 nm wavelength. The hard pellicles for use at such wavelength are conventionally made by attaching, such as by bonding, sealing, encapsulating, and the like, modified fused silica plates to fused silica frames. The pellicle and frame unit is then mounted onto photomask substrates via the fused silica frames to protect the patterned photomask surfaces from contamination by airborne particles.

This conventional process of forming pellicles by attaching a frame to a fused silica plate typically results in small distortions or stresses that can have various effects on the pellicle itself as well as the photomask being protected by such pellicle. For instance, when distortions or stresses occur as a result of attaching a frame to a mask substrate to form a hard pellicle, these distortions and/or stresses are transferred to the hard pellicle, which in turn, create optical distortions or aberrations that distort the projected light during wafer exposure. Further, such stresses may undesirably distort the reticle or even cause stress-induced birefringence or double refraction, i.e., splitting of a light wave into two unequally reflected or transmitted waves, which may result in problems with wafer printing.

As such, conventional processes and the resultant thick and/or hard pellicles formed by such processes are not suitable for efficiently, effectively and reliably protecting photomasks from contamination at the 157 nm exposure wavelength. Consequently, there is a need for improved methods for forming pellicles for use at the 157 nm exposure wavelength.

SUMMARY OF INVENTION

Bearing in mind the problems and deficiencies of the prior art, it is therefore an object of the present invention to provide improved monolithic pellicles for use in photolithography and methods of forming the same.

It is another object of the present invention to provide methods of forming monolithic pellicles and the monolithic pellicles formed that are suitable for efficiently, effectively and reliably protecting photomasks from contamination during photolithography exposure and storage, and will therefore not image any contamination on the wafer undergoing processing.

A further object of the invention is to provide methods of forming monolithic pellicles and the monolithic pellicles formed by such methods suitable for use at or below 157 nm exposure wavelength.

It is yet another object of the present invention to provide methods of forming monolithic pellicles and the monolithic hard pellicles with a single thermal expansion such that the monolithic hard pellicles inherently have low stress levels.

Another object of the present invention is to provide methods of forming monolithic pellicles and the monolithic hard pellicles that are optically compatible with a stepper exposure process.

Still another object of the present invention is to provide methods of forming monolithic pellicles and the monolithic hard pellicles that are robust for mounting and remounting in mask manufacturing such that the pellicle itself is not damaged during removal and reuse processes, thereby avoiding the need for the conventional rework of plate/frame bonding of a pellicle.

Still other objects and advantages of the invention will in part be obvious and will in part be apparent from the specification.

The above and other objects, which will be apparent to those skilled in art, are achieved in the present invention, which is directed to an optical pellicle that includes a transparent plate having a first thickness, a recessed portion of the transparent plate having a second thickness less than the first thickness, and a perimeter of the transparent plate having a third thickness and entirely surrounding the recessed portion such that the transparent plate comprises a monolithic optical pellicle. The first thickness may be an original thickness of the transparent plate, whereby the third thickness of the perimeter is the same as the original thickness. Alternatively, the third thickness may be less than the first thickness.

In this aspect, the transparent plate may include a material such as silica, modified silica, modified fused silica quartz, and the like. It is preferred that the monolithic optical pellicles comprise a single material having a single thermal expansion. It also may be a material that is transparent to an exposure field at about 157 nm wavelengths or even lower. For example, wherein the first thickness of the transparent plate ranges from about 3 mm to about 6 mm, the second thickness of the recessed portion may range from about 200 µm to about 900 µm.

In accordance with the invention, it is preferred that the second thickness of the recessed portion is at least thick enough to prevent sagging thereof due to applied forces on the monolithic optical pellicle. It is also preferred that the monolithic optical pellicle comprise a material of sufficient rigidity for preventing any damage and distortion thereto. The recessed portion extends into the transparent plate from a single surface thereof and stops at a depth within the transparent plate. In so doing, the perimeter comprises a frame portion and the recessed portion comprises an optical pellicle portion of the monolithic optical pellicle, whereby the frame and optical pellicle portions are a uniform one-piece structure.

The monolithic optical pellicle is also provided with first and second optically flat surfaces, as well as the perimeter of the pellicle being provided with a plurality of openings traversing through the perimeter of the transparent plate. These openings may have a variety of shapes and sizes, and are used for introducing a gas flow over the recessed portion of the transparent plate upon mounting the monolithic optical pellicle to a photomask.

In a second aspect of the invention, the present invention is directed to a method of forming an optical pellicle. The method includes providing a pellicle plate of a transparent material having a first thickness. A portion of this transparent material is then removed to transform the pellicle plate into a monolithic optical pellicle. The resultant monolithic optical pellicle comprises a recessed portion of the pellicle plate having a second thickness less than the first thickness that is entirely surrounded and integrally formed with a perimeter frame of the pellicle plate having a third thickness.

The transparent material comprises a material of sufficient rigidity for preventing any stresses and damage to occur in the monolithic optical pellicle. It may also comprise a single material having a single thermal expansion that is transparent to an exposure field at about 157 nm wavelengths or even lower.

The first thickness may comprise an original thickness of the pellicle plate, whereby the third thickness of the perimeter frame also comprises such original thickness. Alternatively, the perimeter frame of the pellicle plate may be adjusted for a standoff distance between the monolithic optical pellicle and a photomask to which the monolithic optical pellicle is to be mounted. This is accomplished by the perimeter frame initially having the first thickness, and removing a predetermined thickness from the first thickness of the perimeter frame to provide the perimeter frame with the third thickness, which is less than the first thickness. The second thickness of the recessed portion is preferably at least thick enough to prevent sagging of the recessed portion due to applied forces on the monolithic optical pellicle.

In this aspect of the invention, the pellicle plate is transformed into the monolithic optical pellicle by providing the pellicle plate into a processing chamber. The pellicle plate is masked on a first side to cover only a perimeter area of the plate such that a central portion of the pellicle plate on the first side remains exposed. This central portion is then processed by removing the transparent material of the pellicle plate from the exposed central portion on the first side. In so doing, the mask protects the perimeter area of the pellicle plate such that the transparent material at the perimeter area is maintained. This removal process stops at a predetermined distance within the pellicle plate to integrally form the recessed portion and the perimeter frame on the first side of the pellicle plate. The mask may then be removed to provide the present monolithic optical pellicle.

The present monolithic optical pellicle is further planarized on first and second surfaces thereof to provide the pellicle with first and second optically flat surfaces. A plurality of openings may be provided that traverse through the perimeter frame for introducing a gas flow over the recessed portion of the pellicle plate.

In another aspect, the invention is directed to a method of protecting a photomask during photolithography. The method includes providing a photomask, and attaching a monolithic optical pellicle thereto for protecting the photomask during subsequent photolithography processing.

BRIEF DESCRIPTION OF DRAWINGS

The features of the invention believed to be novel and the elements characteristic of the invention are set forth with particularity in the appended claims. The figures are for illustration purposes only and are not drawn to scale. The invention itself, both its organization and method of operation, may best be understood by reference to the detailed description which follows taken in conjunction with the accompanying drawings in which:

DETAILED DESCRIPTION

Figure 1A:
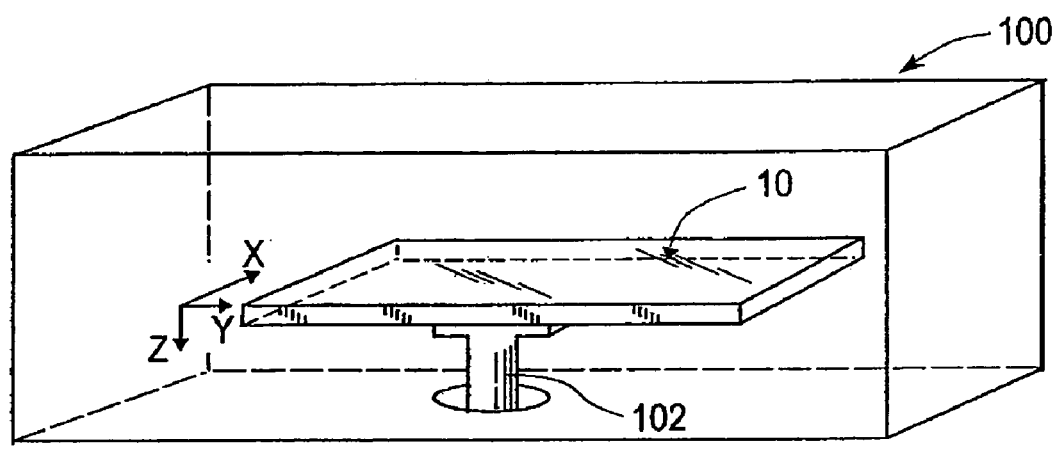
FIG. 1A is an elevational view of a starting solid plate substrate within a processing chamber for forming the monolithic hard pellicle of the invention.

In describing the preferred embodiment of the present invention, reference will be made herein to FIGS. 1A–2D of the drawings in which like numerals refer to like features of the invention.

The present invention is directed to rigid monolithic hard pellicles for use in photolithography and methods of forming the same. An essential feature of the invention is that the present monolithic hard pellicles eliminate the need to bond a modified fused silica plate to a silica frame, and thereby advantageously avoid any induced stresses and/or distortions associated with conventional pellicles having a frame attached to a transparent membrane as discussed above. The monolithic hard pellicles of the invention may be advantageously removed and remounted without distorting, damaging or changing its properties, particularly at its area located at its frame portion and pellicle portion as it is a one-piece uniform structure.

Referring to the drawings, FIG. 1 illustrates a single, hard starting pellicle plate 10 for processing and forming the monolithic pellicle of the invention. This single pellicle plate 10 has sufficient rigidity for processing in accordance with the invention, and may comprise any known suitable material that is transparent to any desired wavelength range used in optical lithography processing, preferably those at 157 nm or even lower. Preferably, the starting pellicle plate 10, for 157 nm applications and below, is a single substrate of silica, more preferably, of modified fused silica such as a "dry" (OH concentrations below 50 ppm by weight, preferably less than 1 ppm by weight), fluorine-doped silica glass.

Rigidity of the starting single, hard pellicle plate substrate 10, preferably starting fused silica plate, is achieved by providing a plate with sufficient original thickness, such as one having an original thickness ranging from about 3 mm to about 6 mm. This sufficient rigidity of the starting pellicle plate assists in preventing any stresses and/or distortions to the resultant monolithic pellicle. While the present invention is directed in particular to fused silica plates having an original thickness in the range of about 3 mm to about 6 mm, it should be appreciated that starting substrates of other materials, sizes and thickness may benefit from the foregoing invention.

In forming the present monolithic pellicle, the single, rigid starting pellicle plate 10 is provided on a rotating platen 105 within a processing chamber 100. The process chamber 100 may comprise any known substrate etching or cutting chamber such as, but not limited to, a plasma assisted chemical etching chamber, a quartz (fused silica) etching chamber, a wet processing chamber, and ion assisted milling chamber and the like. Preferably, the process used to form the present monolithic pellicle 20 is one that is an isotropic process such that only the desired pellicle material at the center of pellicle plate 10 is removed while leaving the perimeter of pellicle plate 10 unprocessed such that a frame portion of the resultant monolithic pellicle is integrally formed.

Figure 1B:
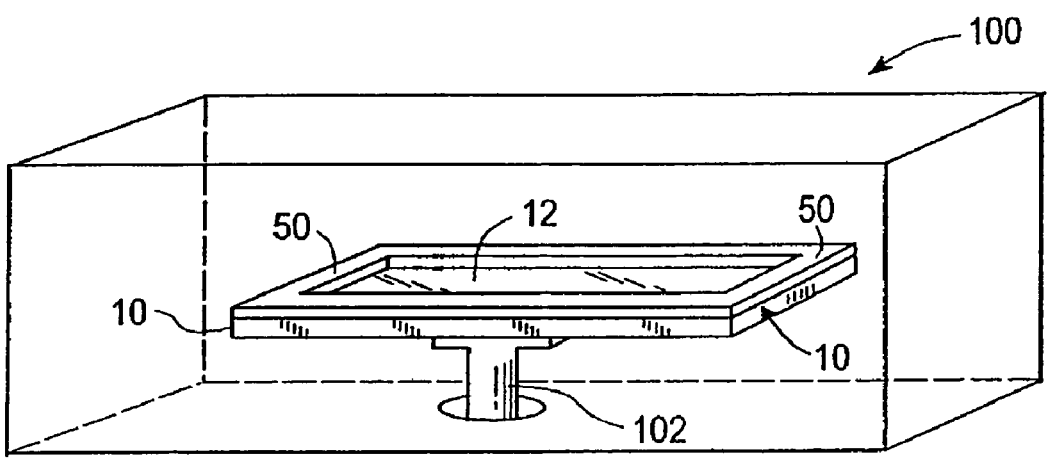
FIG. 1B is an elevational view of the starting solid plate substrate of FIG. 1A having a mask on a surface thereof for processing in accordance with the invention.

For example, referring to FIGS. 1A–B, a starting single pellicle substrate plate 10 may be processed in a plasma-assisted chemical etching chamber 100. The present monolithic pellicle 20 of the invention is formed from this single, one-piece pellicle substrate plate 10 such that the resultant monolithic pellicle 20 maintains a one-piece structure. The starting pellicle substrate plate 10 has a predetermined surface quality, x, y-planar surface area coordinates and initial thickness (i.e., in the z-plane).

The pellicle substrate plate 10 is positioned on and affixed to a pedestal 102 within the processing chamber 100, and then a mask 50 is formed over an exposed surface of the pellicle substrate plate 10. As shown in FIG. 1B, the mask 50 is formed such that it entirely covers a perimeter of the exposed surface of the starting pellicle plate for forming the frame portion of the resultant one-piece, monolithic pellicle of the invention. The mask 50 may be formed by known techniques and may comprise a variety of known masks including, but not limited to, a photoresist mask, a physical hard mask and the like.

Once the mask 50 has been provided on the pellicle plate 10, surface areas 12 of pellicle plate 10 exposed through mask 50 are then removed to a desired depth within the pellicle plate 10 to form monolithic pellicle 20, as is shown in FIGS. 2A–D. This is preferably accomplished by providing a plasma over the structure of FIG. 1B whereby the plasma is adapted to remove only those exposed areas 12 of pellicle plate 10 to the desired depth, while leaving both the mask 50 and the pellicle plate 10 material residing thereunder substantially intact. For example, a bulk portion of the pellicle plate 10 may be removed by milling using a plasma-assisted chemical etch within the process chamber.

The plasma is preferably of a chemistry that is selective to the material of mask 50 such that mask 50 protects the underlying pellicle plate material to form the frame 22 of monolithic pellicle 20. In so doing, milling occurs on a single surface of the pellicle plate, whereby mask 50 protects the underlying peripheral area of the pellicle plate, such that material is removed only at the center or central portion of the single starting pellicle plate 10 and the resultant monolithic pellicle 20 having frame 22 is integrally formed as a one-piece structure.

Removal of the bulk pellicle material may be accomplished by a timed etch, or alternatively, using marker layers to determine an etch stop point within the pellicle plate, i.e., to indicate when a desired location (the marker layer) has been passed. In accordance with the invention, wherein the starting single pellicle substrate plate 10 comprises a modified silica substrate, a marker layer may comprise a nitride layer provided within the modified silica substrate at a predetermined location during the silica substrate growth process.

Referring to FIGS. 2A–D, the removal of bulk pellicle plate material stops at a depth within the plate such that the center portion of the pellicle plate is recessed to a desired depth and does not traverse entirely through the original thickness of the pellicle plate. The amount, or depth, of bulk pellicle plate material removed at the center of the pellicle plate will vary depending upon the ultimate desired pellicle thickness at the center of the resultant monolithic pellicle 20. This desired center pellicle thickness may be achieved by measuring, or predetermining, the original thickness of the starting single pellicle substrate plate, and removing a desired amount at the center, i.e., the pellicle region, of the single starting pellicle substrate based on its original thickness.

For example, wherein the starting pellicle plate has an original thickness of about 4 mm to about 5 mm, bulk pellicle plate material may be removed at the center of the membrane such that remaining pellicle plate material 23 at the bottom of recessed portion 24 has a thickness ranging from about 200 μm to about 900 μm, more preferably from about 300 μm to about 800 μm, depending upon its ultimate use or mounting position. However, it should be appreciated that the remaining pellicle plate material 23 may have a thickness less than 200 μm or greater than 900 μm depending upon the predetermined desired thickness of the bottom optical pellicle portion of the resultant pellicle 20, as well as its ultimate use.

For a better understanding, wherein the monolithic pellicle 20 of the invention is to be vertically mounted on a vertical surface of a photomask, for protection thereof, the remaining pellicle plate material 23 at the bottom of recessed portion 24 may have a thickness of about 300 μm. The pellicle should be as thin as possible for transparency, but thick enough to be mechanically stable and substantially unaffected by gravity and other forces encountered during lithographic processing. Alternatively, wherein the monolithic pellicle 20 of the invention is to be horizontally mounted on a horizontal surface of a photomask, for protection thereof, the remaining pellicle plate material 23 at the bottom of recessed portion 24 is preferred to have a thickness of about 800 μm to compensate for the additional gravitational pull on the monolithic pellicle in this horizontal orientation.

In either horizontal or vertical mounting of the monolithic pellicle 20, it should be appreciated that it is desired that the bottom of recessed portion of the monolithic pellicle 20 be of sufficient thickness to prevent any sag of the bottom area of the recessed portion that may result from gravitational forces. However, if these forces are reduced by vertical mounting of the monolithic pellicle, or by other methods such as reducing the pellicle area or adding support struts, then the bottom area thickness of the recessed pellicle portion 24 can be made thinner in comparison to a bottom area thickness of a recessed pellicle portion of a horizontally mounted monolithic pellicle.

The height or thickness of frame 22 is preferably dictated or based upon the original thickness of the starting pellicle plate, as a result of frame 22 being protected by mask 50 and not etched during the above etch process. That is, frame 22 may have the original thickness 10' of the starting pellicle plate 10. Alternatively, if desired, once the mask 50 has been removed, such as by known methods, the frame 22 may be thinned to a predetermined or desired thickness 11'. It may be desirable to thin frame 22 in order to tune or adjust for the standoff distance between the present monolithic pellicle and the photomask to which it is to be mounted to. Wherein the present monolithic pellicle 20 is for use at an exposure field of about 157 nm wavelengths, the frame 22 may have a width 23 ranging from about 3 mm to about 10 mm and height 25 ranging from about 3 mm to about 6 mm, while the recessed optical pellicle portion 24 has a thickness ranging from about 200 μm to about 900 μm. Alternatively, the width of frame 22 may be customized to less than 3 mm or greater than 10 mm depending upon the exposure field size, such as those less than or greater than 157 nm exposure wavelength.

Once the recessing of the central portion of the monolithic pellicle is complete, processing continues in accordance with the invention by removing mask 50 and planarizing the exposed inner surface 25 of the remaining pellicle plate material 23 at the bottom of recessed portion 24 to provide an optically flat, smooth surface area. In addition, the outer, bottom surface 26 of the monolithic pellicle is also planarized to an optically flat, smooth bottom surface area. Surface area 25 and 26 may be processed to planarity using a mapping technique, such as interferometer metrology, to locate and identify those regions of surface 25 and 26 that require planarization and then planarizing only these identified regions using a tool that allows for such focused, localized planarization. For example, a localized atmospheric plasma etch may be used to remove these localized variations in surface topography on both top surface 25 and bottom surface 26 of the monolithic pellicle 20.

Subsequently, surfaces 25, 26 of pellicle 20 may undergo a final optical surface polish process using known techniques. Thus, in accordance with the above description of the invention, the present monolithic pellicle 20 is provided with optical flatness on both the exposed inner surface area 25 at the bottom of recessed portion 24, as well as at the pellicle's outer, bottom surface area 26.

The resultant monolithic pellicle 20 may have any of a variety of shapes including, but not limited to, rectangular, square, circular and the like. It comprises a rigid, single structure pellicle comprising frame 22 and recessed portion 24. The frame 22 entirely surrounds the recessed portion 24 and maintains the original thickness of the starting pellicle plate 10, or a thickness substantially close to the original thickness. In accordance with the invention, the single, rigid monolithic pellicle 20 is integrally formed as a one-piece, continuous structure. As such, it advantageously avoids the two-step attaching process of conventional approaches, i.e., attaching the pellicle to the frame before attaching the frame to the reticle. In so doing, the simplification of the present invention eliminates the risk of generating distortions or birefringence in the photomask associated therewith.

Figure 2A:
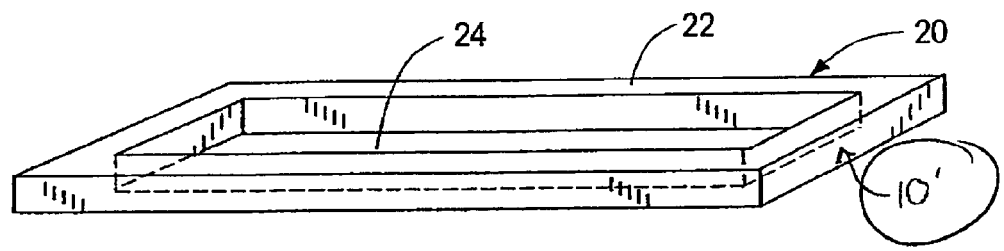
FIG. 2A is an elevational view of the resultant monolithic hard pellicle of the invention processed in accordance with FIG. 1.
Figure 2B:
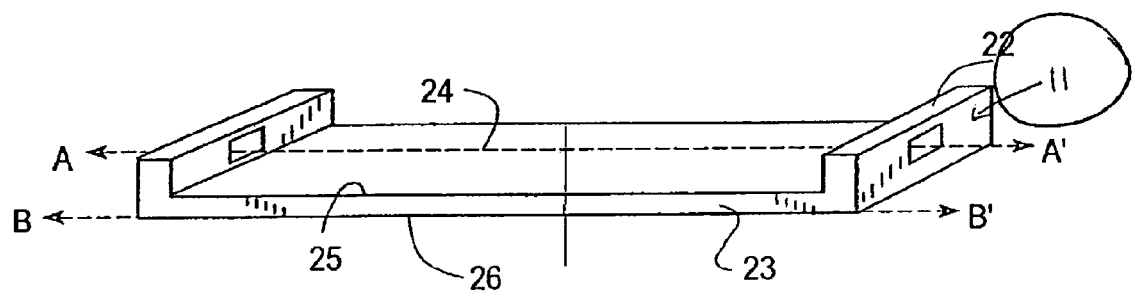
FIG. 2B is an elevational view of a portion of the monolithic hard pellicle of FIG. 2A showing the pellicle as a single, unified solid structure.
Figure 2C:
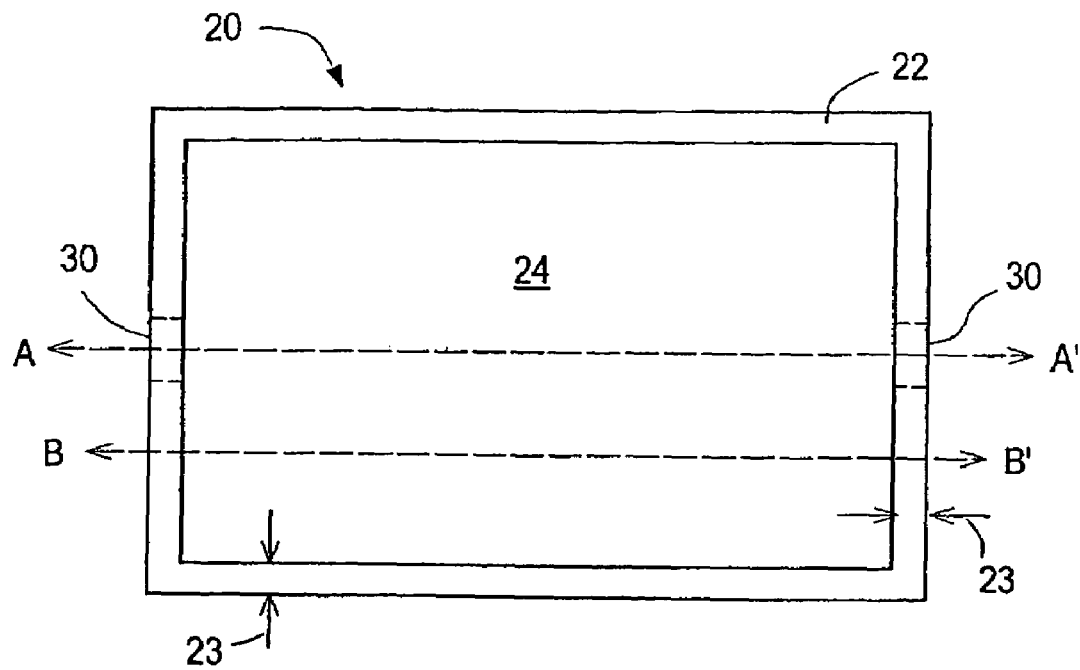
FIG. 2C is a top plan view of the monolithic hard pellicle of FIG. 2A.
Figure 2D:
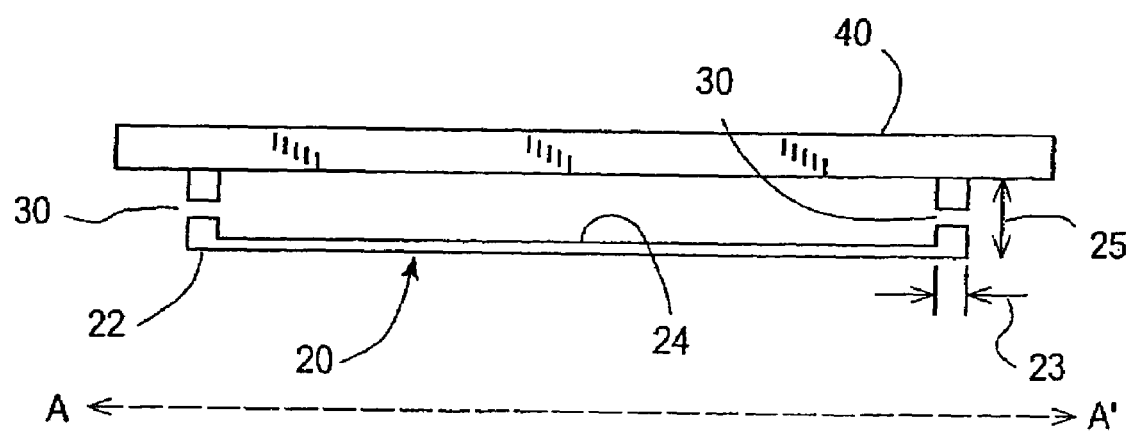
FIG. 2D is a cross sectional view of the monolithic hard pellicle of FIG. 2A.

Referring to FIGS. 2C–D, the present monolithic pellicle 20 may then be mounted onto a photomask 40. Prior to mounting, the monolithic pellicle 20 is provided with openings 30 for the introduction of gases for cleaning or exposure and for air pressure equalization. These openings 30 preferably traverse through the frame 22 of the monolithic pellicle for introducing a gas flow over the recessed optical pellicle portion 24 surface area facing the photomask 40 to which it is mounted. The sizes and locations of such openings 30 are positioned and provided through the frame 22 in a manner that allows the monolithic pellicle to maintain its sufficient rigidity and physical properties. Preferably, at least two openings 30 are provided through the frame 22 preferably by known drilling techniques such as, for example, known silica/quartz drilling techniques. The openings 30 may comprise a variety of shapes including, but not limited to, circular, oval, rectangular, and the like, as well as combinations thereof, and have dimensions ranging from about 1.0 mm to about 2.0 mm. Additionally, wherein the frame 22 is provided with a plurality of these openings 30, the openings may be provided throughout the frame at distances ranging from about every 5.0 mm to about every 8.0 mm. The openings 30 may be fitted with air filters using known techniques. These air filters advantageously prevent particles from passing through the frame onto the reticle surface.

Once openings 30 are formed in the hard monolithic pellicle 20, it may then be mounted onto and bonded to a photomask 40 whereby the frame 22 acts as the mounting frame while the central recessed optical pellicle portion 24 acts as the optical pellicle for use at 157 nm wavelengths and below. The mounting of the monolithic pellicle 20 may be accomplished by known pellicle mounting techniques, such as by attaching frame portion 22 to the photomask 40 using a glue, adhesive, bonding agent, and the like.

Once mounted, the hard monolithic pellicle 20 is easily removed from the photomask 40 for rework such that only the attaching/bonding means holding the frame to the photomask, i.e., glue, adhesive, bonding agent, and the like, must be removed. That is, as the frame portion 22 and optical pellicle portion 24 of the monolithic pellicle 20 are a single one-piece structure, they advantageously do not detach from one another during rework processing, as compared to conventional frames bonded to an optical pellicle which often detach from one another during such rework processes. Another advantage of the present rigid monolithic pellicle 20 is that it is not damaged or distorted from or during rework processing as a result of its sufficient rigidity.

Thus, in accordance with the invention, the present monolithic pellicle 20 is integrally formed as a single, one-piece optical pellicle portion and frame portion that is particularly useful at or below 157 nm exposure wavelengths. As it is structurally a single, one-piece monolithic pellicle formed from a single pellicle plate, it avoids the conventional need for bonding a frame to an optical pellicle, as well as avoids material mismatch between the frame portion and optical pellicle portion. The monolithic pellicle 20 comprises a single material such that it has a single thermal expansion. Wherein the monolithic pellicle 20 includes a marker layer, the concentration of marker layer material is insignificantly small relative to the host material, i.e., the transparent material of the pellicle, such that marker layer material has essentially no measurable affect on the thermal properties. The monolithic pellicle 20 has inherently low stress levels due to its single thermal expansion, and is sufficiently robust to withstand any stresses endured as a result of mounting and/or remounting in mask manufacturing. Additionally, the hard monolithic pellicle 20 of the invention achieves advantages over the prior art by eliminating the need to bond an optical plate to a frame, and thereby reducing any risk of generating distortions or birefringence in the photomask to which it is mounted. Due to the present monolithic pellicle one-piece structure, it beneficially has an extended useful life as compared to conventional pellicles having a frame attached to an optical pellicle, which easily detach from one another, damage and/or distort thereby ending the conventional pellicle's useful life.

While the present invention has been particularly described, in conjunction with a specific preferred embodiment, it is evident that many alternatives, modifications, and variations will be apparent to those skilled in the art in light of the foregoing description. It is therefore contemplated that the appended claims will embrace any such alternatives, modifications, and variations as falling within the true scope and spirit of the present invention.

The invention claimed is:

1. An optical pellicle comprising:
   a transparent plate;
   a recessed portion of said transparent plate having a first thickness;
   a perimeter of said transparent plate having a second thickness ranging from about 3 mm to about 6 mm and entirely surrounding said recessed portion such that said transparent plate comprises a monolithic optical pellicle; and
   a plurality of openings traversing through said perimeter for introducing a gas flow over said recessed portion upon mounting said monolithic optical pellicle to a photomask.

2. The optical pellicle of claim 1 wherein said transparent plate comprises a material selected from the group consisting of silica, modified silica, quartz and modified fused silica quartz.

3. The optical pellicle of claim 1 wherein said first thickness ranges from about 200 µm to about 900 µm.

4. The optical pellicle of claim 1 wherein said transparent plate comprises a material transparent to an exposure radiation ranging from about 157 nm wavelengths and lower.

5. The optical pellicle of claim 1 wherein said first thickness of said recessed portion prevents sagging of said recessed portion due to applied forces on said monolithic optical pellicle.

6. The optical pellicle of claim 1 wherein said recessed portion extends into said transparent plate from a single surface thereof and stops at a depth within said transparent plate.

7. The optical pellicle of claim 1 wherein said monolithic optical pellicle comprises a single material having a single thermal expansion.

8. The optical pellicle of claim 1 wherein said perimeter comprises a frame portion and said recessed portion comprises an optical pellicle portion of said monolithic optical pellicle, said frame and optical pellicle portions being a uniform one-piece structure.

9. The optical pellicle of claim 1 wherein said monolithic optical pellicle comprises a first side having a substantially planar surface and a second side having said recessed portion and said perimeter, wherein at least said recessed portion has an optically flat surface area.

10. The optical pellicle of claim 1 wherein said monolithic optical pellicle has a rectangular shape.

11. The optical pellicle of claim 1 further including a plurality of air filters within said plurality of openings for preventing particles from passing through said perimeter onto said photomask.

12. The optical pellicle of claim 1 wherein said plurality of openings traversing through said perimeter have shapes selected from the group consisting of circular, oval, rectangular, square and combinations thereof.

13. The optical pellicle of claim 1 wherein said monolithic optical pellicle has a square shape.

14. The optical pellicle of claim 1 wherein said monolithic optical pellicle has a circular shape.

15. A method of forming an optical pellicle comprising:
    providing a pellicle plate of a transparent material having a first thickness ranging from about 3 mm to about 6 mm; and
    removing a portion of said transparent material to transform said pellicle plate into a monolithic optical pellicle comprising a recessed portion of said pellicle plate having a second thickness less than said first thickness, and a perimeter frame that entirely surrounds and is integrally formed with said recessed portion of said pellicle plate.

16. The method of claim 15 wherein said transparent material comprises a single material having a single thermal expansion that is transparent to an exposure radiation ranging from about 157 nm wavelengths and lower.

17. The method of claim 15 wherein said second thickness of said recessed portion ranges from about 200 µm to about 900 µm.

18. The method of claim 15 wherein said perimeter frame of said pellicle plate has said first thickness.

19. The method of claim 15 further including adjusting for a standoff distance between said monolithic optical pellicle and a photomask to which said monolithic optical pellicle is to be mounted to, said step of adjusting for said standoff distance comprising:
    said perimeter frame of said pellicle plate initially having said first thickness; and
    removing a predetermined thickness from said first thickness of said perimeter frame to provide said perimeter frame with a third thickness, which is less than said first thickness.

20. The method of claim 15 wherein said second thickness of said recessed portion prevents sagging of said recessed portion due to applied forces on said monolithic optical pellicle.

21. The method of claim 15 wherein said step of transforming said pellicle plate into said monolithic optical pellicle comprises:
    providing said pellicle plate into a processing chamber;
    providing a mask on a first side of said pellicle plate to cover only a perimeter area of said pellicle plate, thereby exposing a central portion of said pellicle plate on said first side;
    removing said transparent material of said pellicle plate from said exposed central portion on said first side whereby said mask protects said perimeter area of said pellicle plate such that said transparent material at said perimeter area is maintained;
    stopping said removal at a predetermined distance within said pellicle plate to integrally form said recessed portion and said perimeter frame on said first side of said pellicle plate; and
    removing said mask to provide said monolithic optical pellicle.

22. The method of claim 21 further including the steps of:
    planarizing said recessed portion on said first side of said pellicle plate to provide said monolithic optical pellicle with a first optically flat surface at said recessed portion; and planarizing an opposing second side of said pellicle plate to provide said monolithic optical pellicle with a second optically flat surface.

23. The method of claim 15 further including the step of providing a plurality of openings traversing through said perimeter frame of said pellicle plate of said monolithic optical pellicle for introducing a gas flow over said recessed portion of said pellicle plate.

24. The method of claim 23 further including the step of mounting said monolithic optical pellicle to a photomask by attaching said perimeter frame to said photomask, said mounted monolithic optical pellicle protecting said photomask during subsequent processing.

25. The method of claim 24 further including the step of detaching said monolithic optical pellicle from said photomask whereby damage to said monolithic optical pellicle is avoided as a result of said recessed portion being integrally formed with said perimeter frame.

26. A method of protecting a photomask during photolithography comprising:

providing a photomask; and attaching a monolithic one-piece optical pellicle having a recessed portion with a thickness ranging from about 200 μm to about 900 μm and a frame with a thickness ranging from about 3 mm to about 6 mm to said photomask for protecting said photomask during subsequent photolithography processing.

27. The method of claim 26 wherein said monolithic one-piece optical pellicle is vertically mounted to said photomask.

28. The method of claim 26 wherein said monolithic one-piece optical pellicle is horizontally mounted to said photomask.

* * * * *